(12) United States Patent
McSherry et al.

(10) Patent No.: US 6,249,903 B1
(45) Date of Patent: *Jun. 19, 2001

(54) METHOD AND APPARATUS FOR GENERATING AND MAINTAINING ELECTRICAL MODELING DATA FOR A DEEP SUB-MICRON INTEGRATED CIRCUIT DESIGN

(76) Inventors: Michael C. McSherry, 2645 SW. Brae Mar Ct., Portland, OR (US) 97201; Richard E. Strobel, 5305 NE. 132$^{nd}$ Way, Vancouver, WA (US) 98686; Robert A. Todd, 10226 SW. Kent Ct., Tigard, OR (US) 97224; Paul M. Nugyen, 10701 SW. Heron Cir., Beaverton, OR (US) 97007-6189

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,915

(22) Filed: Mar. 31, 1998

(51) Int. Cl.$^7$ .................................................. G06F 17/50
(52) U.S. Cl. .............................................................. 716/11
(58) Field of Search .................... 395/500.02, 500.06, 395/500.13; 716/12, 11

(56) References Cited

U.S. PATENT DOCUMENTS

| | | | |
|---|---|---|---|
| 5,896,300 | * | 4/1999 | Raghaven .............................. 716/11 |
| 5,999,726 | * | 12/1999 | Ho .................................... 395/500.06 |
| 6,006,024 | * | 12/1999 | Guruswamy .................... 395/500.13 |

\* cited by examiner

Primary Examiner—Matthew Smith
Assistant Examiner—Thuan Do
(74) Attorney, Agent, or Firm—Columbia IP Law Group, PC

(57) ABSTRACT

A parasitic extraction tool (PEX) is provided to generate electrical modeling data for an integrated circuit (IC) design, e.g. a deep sub-micron IC design. The PEX includes a read function for reading extracted connectivity and geometrical data of various layout cell hierarchies of the IC design, that are organized and indexed by layout nets. The PEX also includes a write function for writing generated electrical modeling data into a parasitic database (PDB), which is physically organized to accommodate physical storage of the electrical modeling data in multiple physical media, and concurrent usage of the electrical data by multiple client applications, e.g. post layout analysis tool. In one embodiment, the PDB further includes an application interface that shields the physical organization of the PDB, and a logical abstraction of the physical organization to facilitate implementation of the application interface.

61 Claims, 16 Drawing Sheets

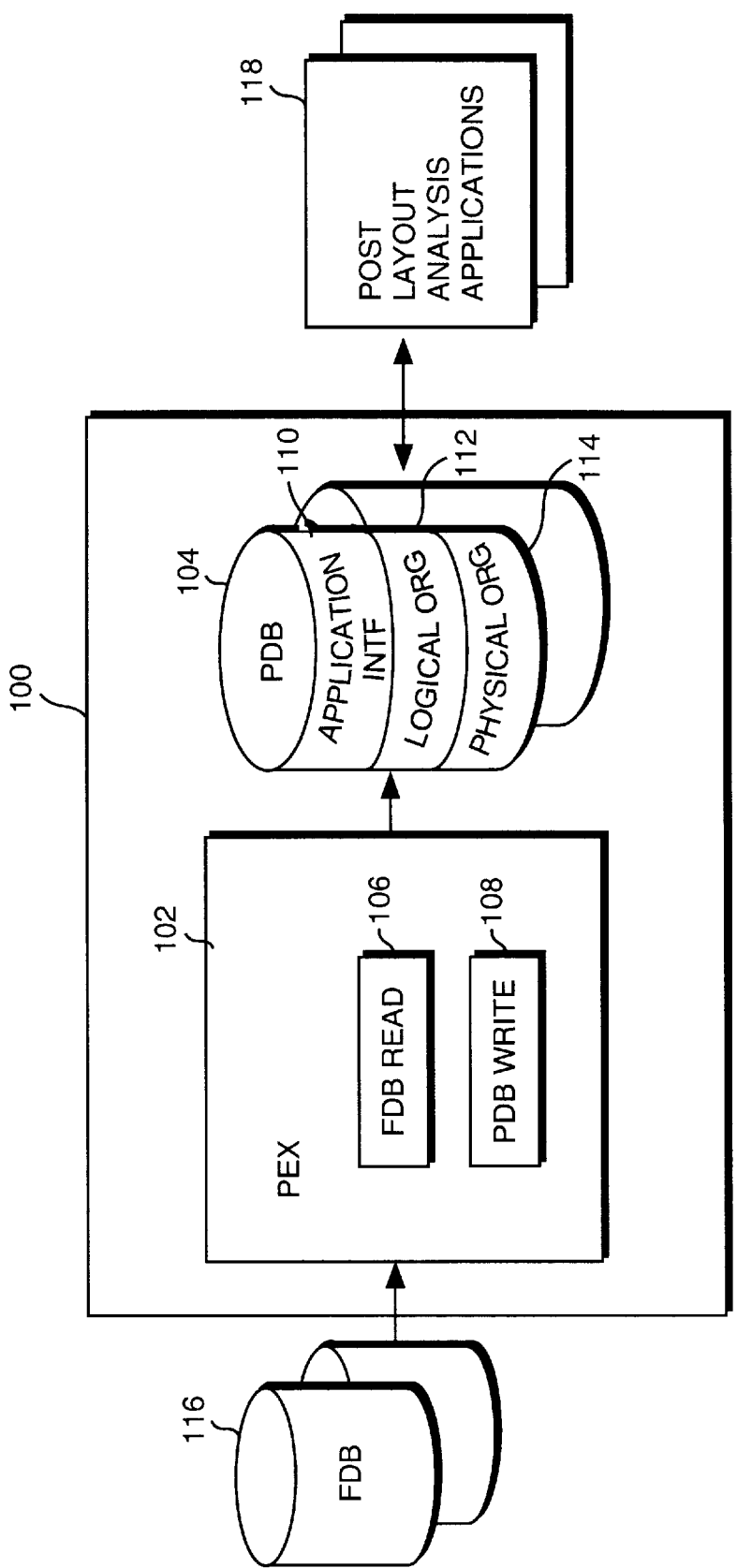

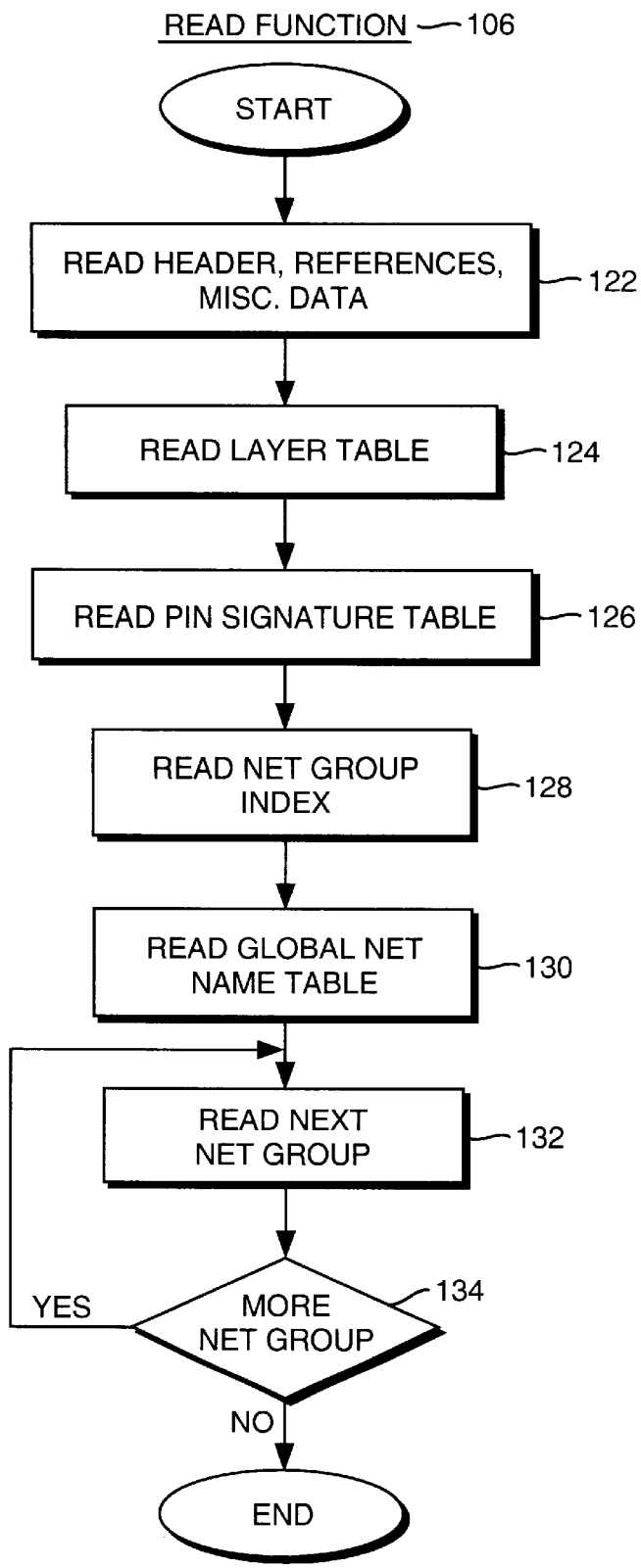

THE COMPOSITE ADDRESS (32 BITS)

( BYTE ADDRESS IN OCTAL)

GENERIC FIRST CHUNK OF EACH BLOCK

THE TYPE FIELD (EIGHT BITS)

FIG. 3F

|     | 0 | 1 | 2 | 3 | 4 | 5 | 6 | 7 |
|-----|---|---|---|---|---|---|---|---|
| 00  | 80 | 0 | SERIAL | PDB DESIGNATOR ||| FIRST- |
| 10  | -FREE CHUNK ||| RESERVED ||||
| 20  ||||||||
| 30  ||||||||

SINGLE CHUNK OF SYSINFO RECORD  ( BYTE ADDRESS IN OCTAL)

FIG. 3G

|      | 0 | 1 | 2 | 3 | 4 | 5 | 6 | 7 |
|------|---|---|---|---|---|---|---|---|
| 00   | 0X81 | 0X22 || RESERVED |||||
| 10   ||||||||
| 20   | 256 BIT WRITE FLAG FIELD ||||||||
| 30   ||||||||
| 40   ||||||||
| 50   | INDEX[0] |||| INDEX[1] ||||
| 60   | INDEX[2] |||| INDEX[3] ||||
| 70   | INDEX[4] |||| INDEX[5] ||||
| 2040 | INDEX[254] |||| INDEX[255] ||||

(BYTE ADDRESSES IN OCTAL)
SINGLE BLOCK INDEX RECORD ( BYTE ADDRESSES IN OCTAL)

FIRST CHUNK OF EACH BLOCK OF A FREE RECORD ( BYTE ADDRESSES IN OCTAL)

FIRST CHUNK OF EACH BLOCK OF A RAW RECORD

FIG. 3J

|    | 0 | 1 | 2 | 3 | 4 | 5 | 6 | 7 |
|----|---|---|---|---|---|---|---|---|
| 00 | 0X8D | BLOCKF | | LINK | | | | LAST- |
| 10 | -BLOCK ADDR | | | LAST BYTE OFFSET | | | | BLOCK- |
| 20 | COUNT | | | DATA | | | | |
| 30 | | | | | | | | |

( BYTE ADDRESSES IN OCTAL)

FIRST CHUNK OF FIRST BLOCK OF A COUNTED RECORD

FIG. 3K

|    | 0 | 1 | 2 | 3 | 4 | 5 | 6 | 7 |
|----|---|---|---|---|---|---|---|---|
| 00 | 0X89 | BLOCKF | | LINK | | | | |
| 10 | DATA | | | | | | | |
| 20 | | | | | | | | |
| 30 | | | | | | | | |

RECORD TYPE ( BYTE ADDRESSES IN OCTAL)

FIRST CHUNK OF EACH SUBSEQUENT BLOCK OF
A COUNTED RECORD

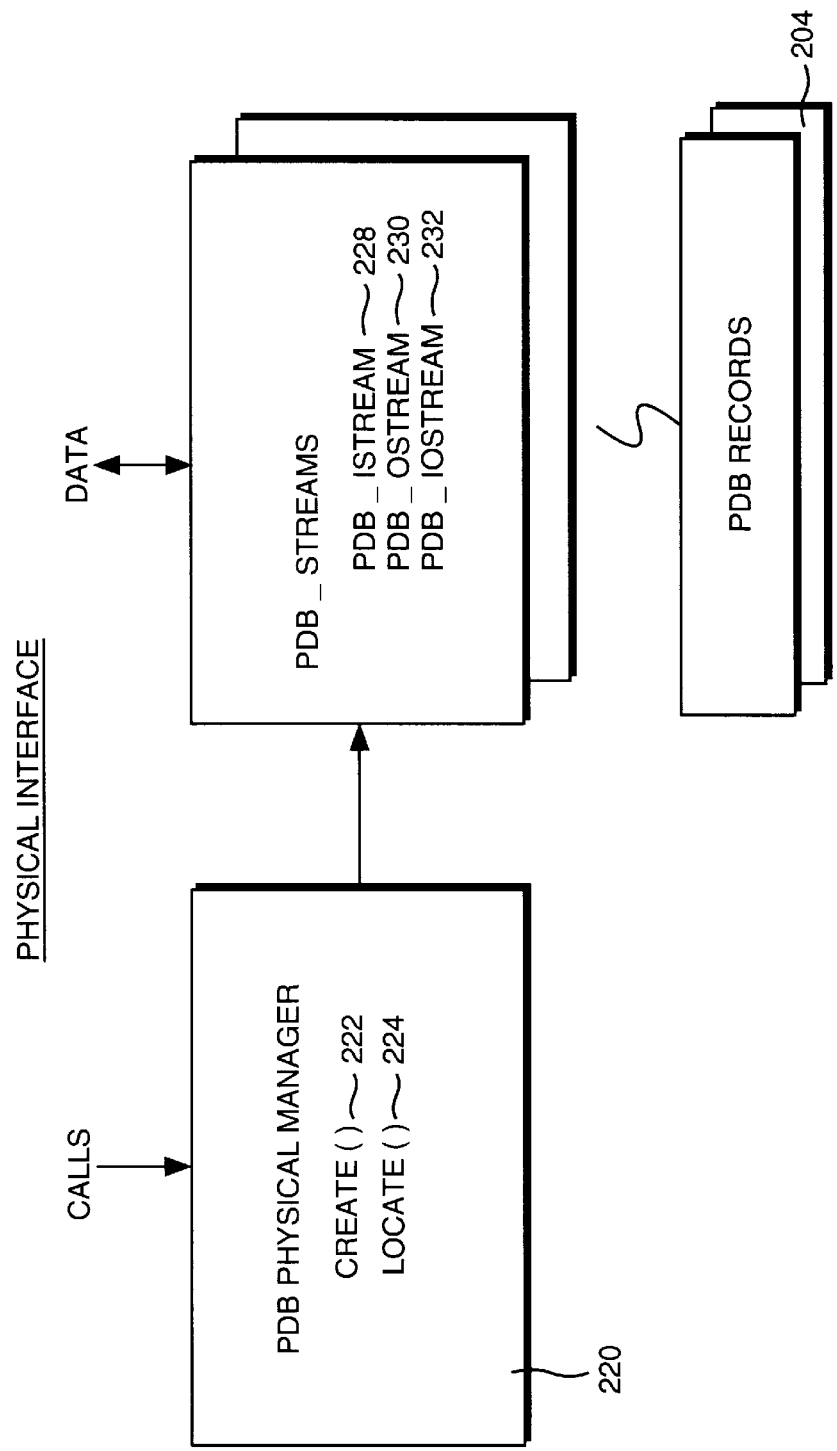

PDB LOGICAL ORGANIZTION~112

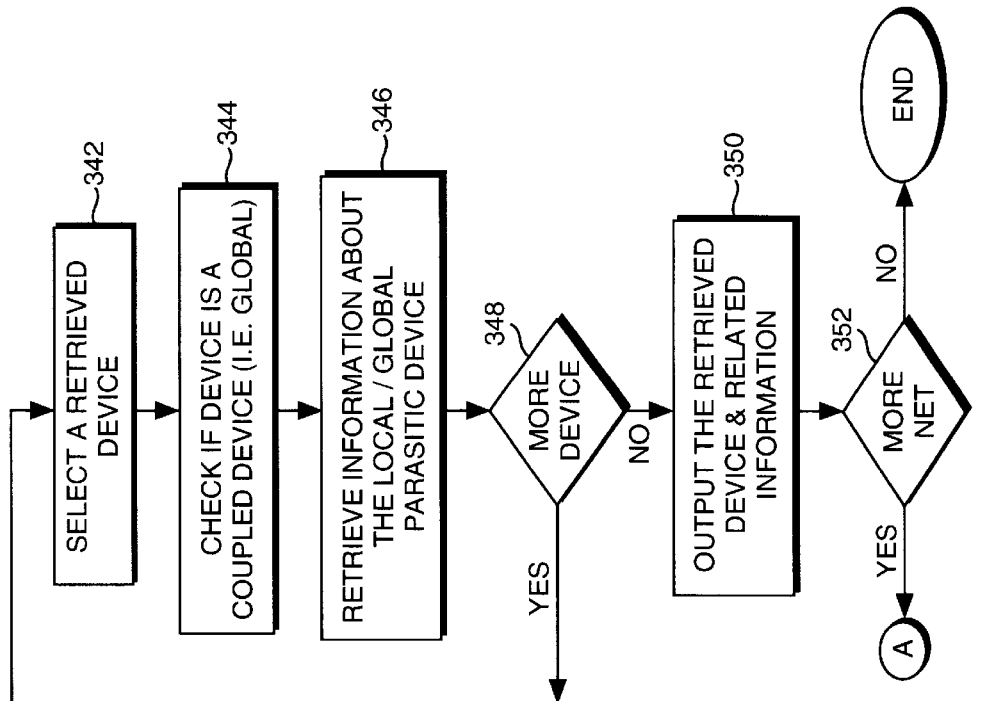
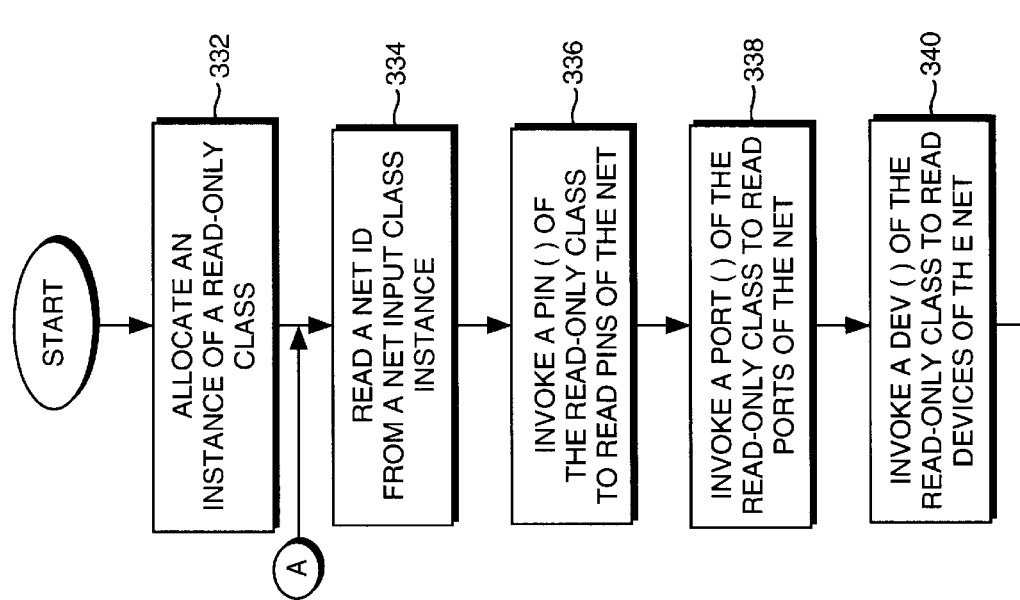
FIG. 7A

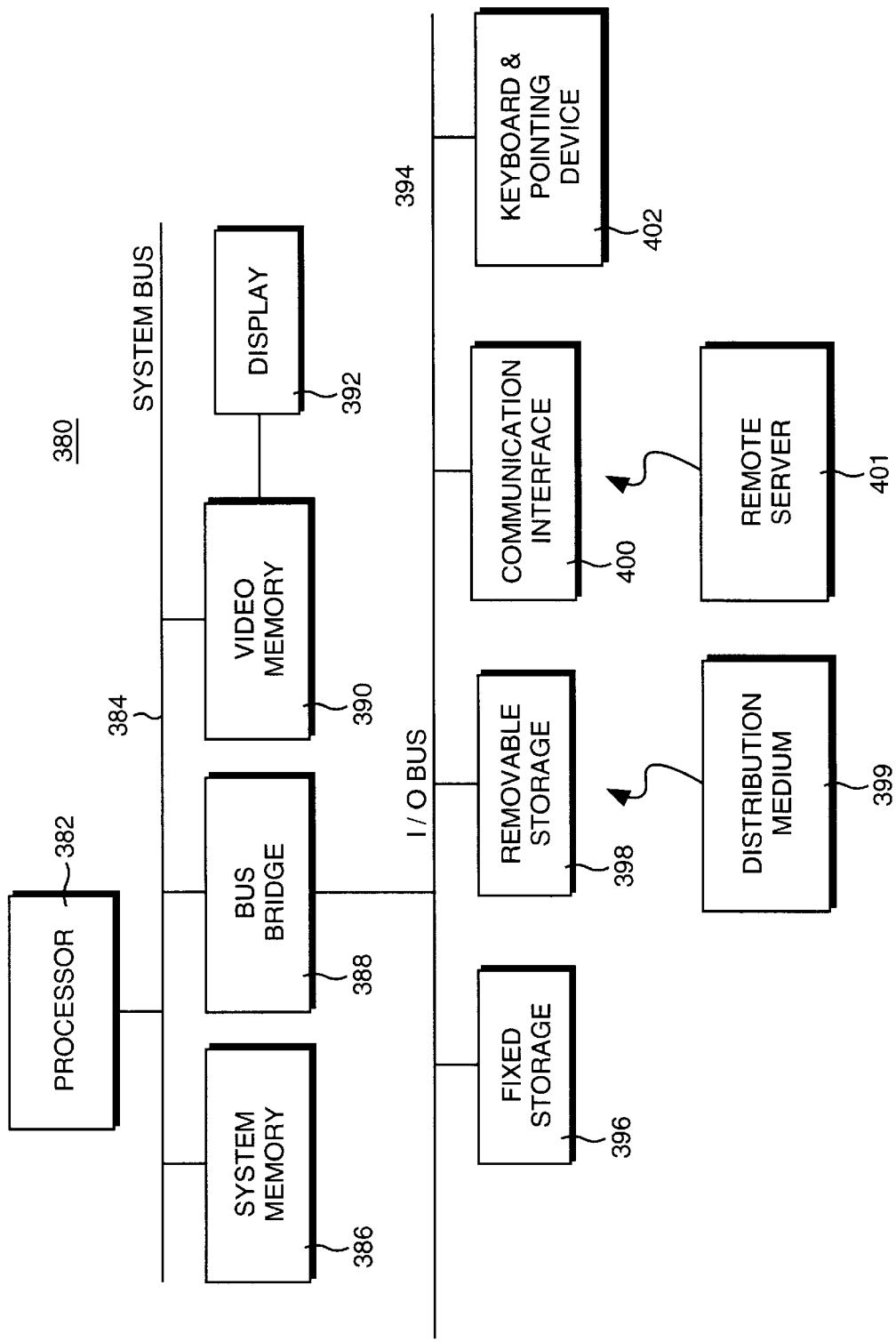

METHOD AND APPARATUS FOR GENERATING AND MAINTAINING ELECTRICAL MODELING DATA FOR A DEEP SUB-MICRON INTEGRATED CIRCUIT DESIGN

BACKGROUND OF THE INVENTION

1. Field of the Invention

The present invention relates to the field of electronic design automation (EDA). More specifically, the present invention relates to EDA tools for parasitic extraction in the process of designing sub-micron integrated circuit.

2. Background Information

The technology of large scale integration continues to advance rapidly. Integrated circuits (IC) fabricated employing deep sub-micron processes are increasingly common and increasingly complex. One of the challenges faced by today's deep sub-micron IC designers is the issue of parasitic effects of passive interconnect. Deep sub-micron IC designers have come to recognize that these effects cannot be ignored, else the design can fail. These effects play an important role in timing, power, reliability as well as noise performance. In order to take parasitic effects of passive interconnect into consideration in post layout analysis for timing, power, etc., it is necessary to create electrical models for the physical connections present between the various devices in a deep sub-micron IC design, a process known as parasitic extraction. Multiple parasitic extractions performed repeatedly at different points in time to create multiple electrical models for different views of the design are often required.

With respect to parasitic extraction for deep sub-micron IC designs, conventional EDA tools typically suffer from at least four disadvantages.

(a) They do not support enough rich models to describe the increasingly complex processes;

(b) They do not adequately address electrical interdependence between a physical net model and a design model;

(c) They are incapable of dealing with the enormous data volumes generated by the increasingly complex deep sub-micron designs; and (d) They do not efficiently support concurrent use by multiple post-layout analysis tools.

Thus, a more effective and yet efficient approach to generating and storing electrical modeling data for a deep sub-micron IC design that are comprehensive and organized to meet the needs of post-layout analysis is desired.

SUMMARY OF THE INVENTION

A parasitic extraction tool (PEX) is provided to generate electrical modeling data for an integrated circuit (IC) design, e.g. a deep sub-micron IC design. The PEX includes a read function for reading extracted connectivity and geometrical data of various layout cell hierarchies of the IC design, that are organized and indexed by layout nets. The PEX also includes a write function for writing generated electrical modeling data into a parasitic database (PDB), which is physically organized to accommodate physical storage of the electrical modeling data in multiple physical media, and current usage of the electrical data by multiple client applications, such as post layout analysis tools. In one embodiment, the PDB further includes an application interface that shields the physical organization of the PDB, and a logical abstraction of the physical organization to facilitate implementation of the application interface.

BRIEF DESCRIPTION OF DRAWINGS

The present invention will be described by way of exemplary embodiments, but not limitations, illustrated in the accompanying drawings in which like references denote similar elements, and in which:

FIG. 1 illustrates one embodiment of the present invention including a parasitic extraction tool (PEX) and a parasitic database (PDB);

FIGS. 2a–2c illustrate one embodiment of the read function of PEX;

FIGS. 3a–3k illustrate one embodiment of a physical organization of PDB;

FIG. 4 illustrates one embodiment of a physical interface to PDB;

FIGS. 7a–7b illustrate one embodiment each of an exemplary series of read and write operations of client application; and FIG. 8 illustrates one embodiment of a computer system suitable for programming with the present invention.

DETAILED DESCRIPTION OF THE INVENTION

Figure 2C:
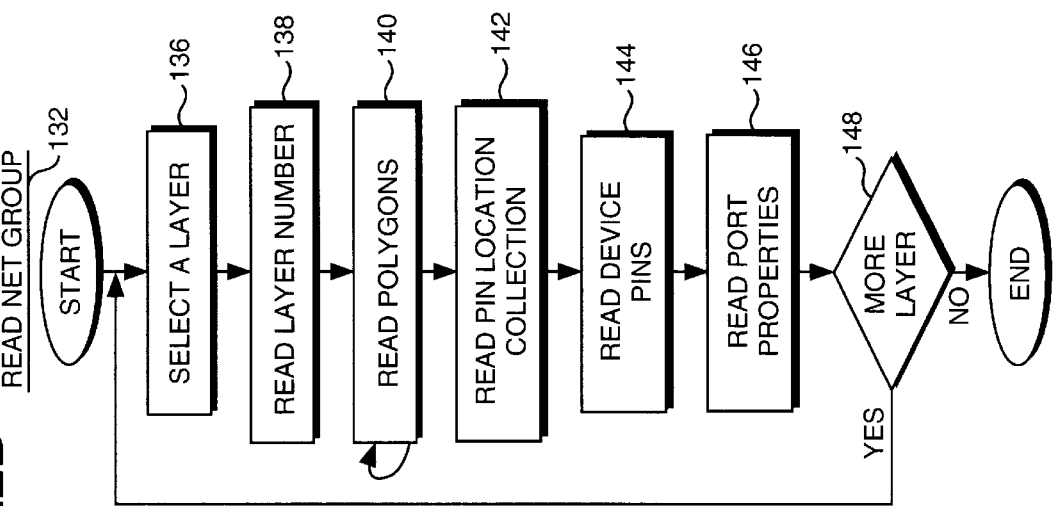

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps in turn, in a manner that is most helpful in understanding the present invention, however, the order of description should not be construed as to imply that these operations are necessarily order dependent. In particular, these operations need not be performed in the order of presentation.

Referring now to FIG. 1, wherein a block diagram illustrating one embodiment of the present invention is shown. As illustrated, the present invention includes parasitic extraction tool (PEX) 102 and parasitic database (PDB) 104. PEX 102 generates electrical modeling data for layout nets of an IC design, e.g. a deep sub-micron IC design, and stores the generated electrical modeling data in PDB 104 for use by client applications, such as post layout analysis applications 118. Examples of post-layout analysis applications 118 include Delay Calculator by Ultima Technology of Sunnyvale, Calif., and Path Mill and Time Mill by Synopsis Inc. of Mountain View, Calif.

PEX 102 generates the electrical modeling data for the layout nets using extracted connectivity and geometrical data of the layout nets. As shown, PEX 102 includes read function 106 that operates to input these connectivity and geometrical data of the layout nets. For the illustrated embodiment, the extracted connectivity and geometrical data of the layout nets are input from filtered databases (FDB) 116. The extracted connectivity and geometrical data are stored in FDB 116 by layout cell hierarchies, one FDB per layout cell hierarchy, and indexed by layout nets. The connectivity and geometrical data were extracted at least in part in accordance with specified parasitic effect windows of the various layers of the IC design. A parasitic effect window defines a distance from geometric shapes on a given layout layer beyond which parasitic effects are ignored. Read function 106 operates to retrieve the connectivity and geometrical data of the layout nets from FDB 116 using the stored layout net indices. FDB 116 is the subject of co-pending U.S. patent application Ser. No. 09/052,895, filed contemporaneously, having common inventorship and assignee of the present invention. The co-pending application is hereby fully incorporated by reference.

PDB 104 is designed to accommodate a large volume of electrical modeling data and concurrent accesses by multiple client applications, which is typical of today's and future deep sub-micron IC designs and design environments. For the illustrated embodiment, PDB 104 has physical organization 114 that allows a large volume of electrical modeling data to be stored in multiple physical media, and application interface 110 that shields physical organization 114 from PDB users, e.g. PEX 102 and post layout analysis applications 118. Additionally, PDB 102 has logical organization 112 that abstracts physical organization 114 to facilitate implementation of application interface 110.

For the illustrated embodiment, PEX 102 includes write function 108 that operates to store the generated electrical modeling data of the layout nets into PDB 104 using application interface 110. In alternate embodiments, write function 108 may store the generated electrical modeling data of the layout nets using either logical and/or physical organizations 112–114. Similarly, selected ones of the client applications, e.g. post-layout analysis applications 118, may also elect to access PDB 104 through logical and/or physical organizations 112–114.

Except for read function 106 and write function 108, PEX 102 is intended to represent a broad category of electrical modeling tools known in the art. Examples of these electrical modeling tools include but not limited to Pattern Engine of xCalibre by Mentor Graphics, Columbus by Frequency Technology of San Jose, Calif., and Arcadia by Synopsis. Thus, except for read and write functions 106–108, PEX 102 will not be otherwise further described. Read function 106, PDB 104, write function 108, and exemplary read/write operations of client applications, such as post layout analysis application 118, will be described in turn below.

Figure 2B:
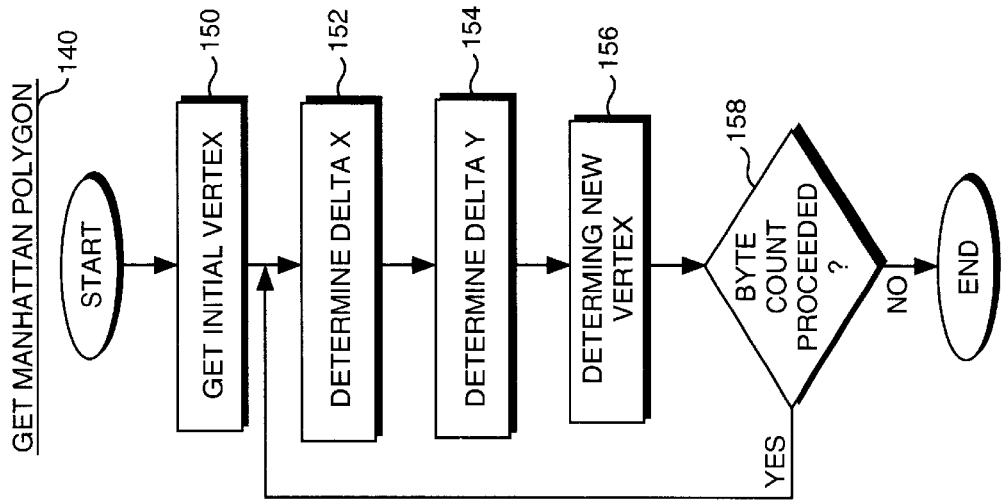

Referring now to FIGS. 2a–2c, wherein three block diagrams illustrating one embodiment of read function 106 are shown. As illustrated in FIG. 2a, upon invocation, read function 106 starts operation at step 122 where it reads the content of a header, a reference and a miscellaneous data segment of FDB 116. In one embodiment, the header segment contains control information such as file identification and so forth, whereas the reference segment contains offsets to the other data segments of a FDB 116, and the miscellaneous data segment contains control information about the various control files employed to extract the stored connectivity and geometrical data. At step 124, read function 106 uses the retrieved offsets to locate a "layer" segment having a layer table, and access the layer table to retrieve various layout layer information about the IC design. Similarly, at step 124, read function 106 uses the retrieved offsets to locate a "pin signature" segment having a pin signature table, and accesses the pin signature table to retrieve various pin related information for the various layers of the IC design.

At step 128, read function 106 uses the retrieved offsets to locate a "net index" segment having a net index table, and accesses the net index table to retrieve various layout net indices to the corresponding connectivity and geometrical data. At step 130, read function 106 uses the retrieved offsets to locate a "net name" segment having a net name table, and accesses the net name table to retrieve the net names of the various indexed layout nets. Finally, read function 106 repeatedly retrieves the connectivity and geometrical data of the various layout nets, that were extracted at least in part in accordance with specified parasitic windows of the various layers, one layout net at a time, until the desired data are retrieved for all layout net of interest, steps 132–134.

FIG. 2b illustrates one embodiment of step 132 of FIG. 2a. As shown, to perform step 132, read function 106 first selects a layout layer, step 136, then reads the layer number, step 138. Using these information, read function 106 retrieves various geometries of the layer, i.e. polygons, step 140. In one embodiment, read function 106 performs a number of get Manhattan polygon operations, while the amount of data retrieved is less than a specified byte count. Having retrieved all the polygons for the layer, read function 106 retrieves location information for all pins of the layer, step 142. Then, read function 106 retrieves information related to the device pins, and port properties, steps 144–146. At step 148, read function 106 determines if there are more layers with data to be retrieved. If so, read function 106 repeats steps 136–146. Read function 106 repeats steps 136–148 until eventually it is determined at step 148 that data for all layers have been retrieved.

FIG. 2c illustrates one embodiment of step 140 of FIG. 2b for performing a get Manhattan polygon operation. As shown, to perform step 140, read function 106 first gets an initial vertex, step 150, then determines delta X and delta Y, step 152–154. Upon determining the delta values for both axes, read function 106 uses the determined delta values to determine the new vertex, step 156. At step 158, read function 106 determines if the specified maximum byte count threshold has been reached. If so, read function 106 repeats steps 150–158. Read function 106 repeats steps 150–158 until eventually it is determined at step 158 that the specified maximum byte count threshold has been reached.

Figure 3A:
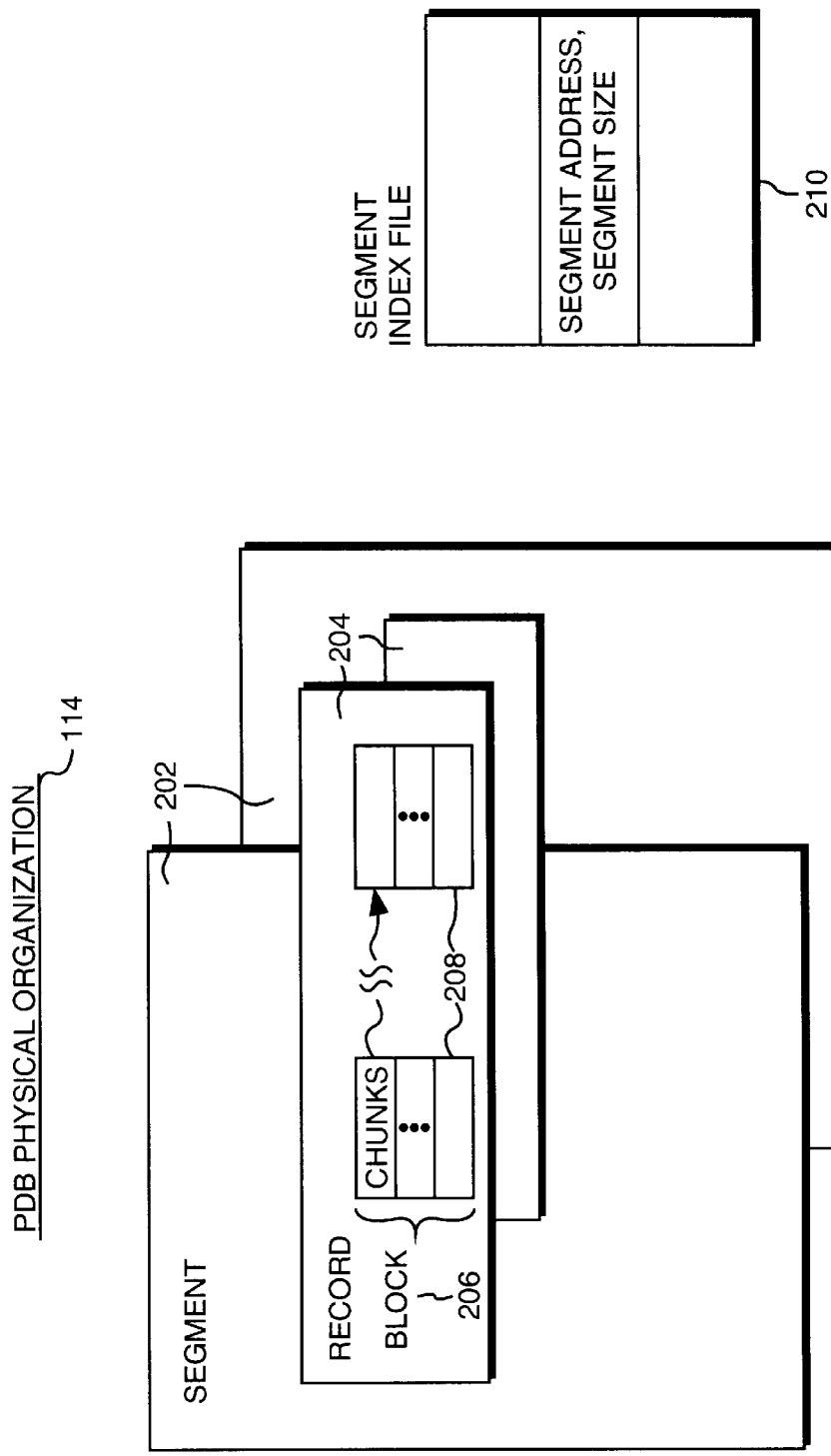

Referring now to FIGS. 3a–3k, wherein eleven block diagrams illustrating one embodiment of physical organization 114 of PDB 104 are shown. As described earlier, physical organization 114 is designed to accommodate a large volume of electrical modeling data that is typical of today's and future deep sub-micron IC designs, and concurrent access by multiple post-layout analysis tools, which is typical of today's and future IC design environment. For the illustrated embodiment, as shown in FIG. 3a, PDB 104 is comprised of one or more segments 202 of storage locations. Each segment's address and its size are maintained in segment index file 210. The basic unit of allocation within each segment 202 is a chunk 208 of storage locations. A number of contiguous chunks 208 form a block 206. The basic unit of interaction with a client application, e.g. a post layout analysis application, is a record 204, which is constituted with one or more blocks 206. Note that a record 204 may span multiple segments 202. Records 204 are typed to differentiate the different types of control and data records. In one embodiment, each chunk 208 is 32 bytes, and a segment 202 may contain up to 67,108,864 chunks 208. A PDB 104 may contain up to 64 segments, giving a maximum PDB size of over 137 giga-bytes. Furthermore, record types include two data record types, a raw data record type and a counted data record type, and three control record types, a system information (sysinfo) record type, an indexed record type, and a free record type (for maintenance of allocated by unused data space).

Figure 3B:
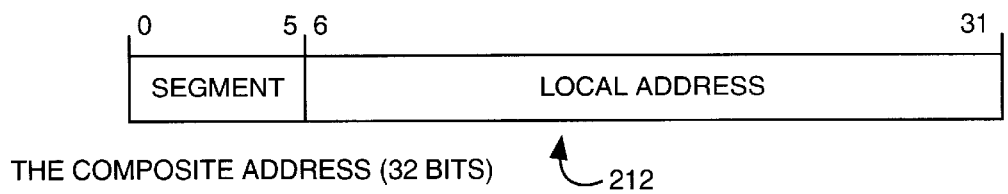
Figure 3C:
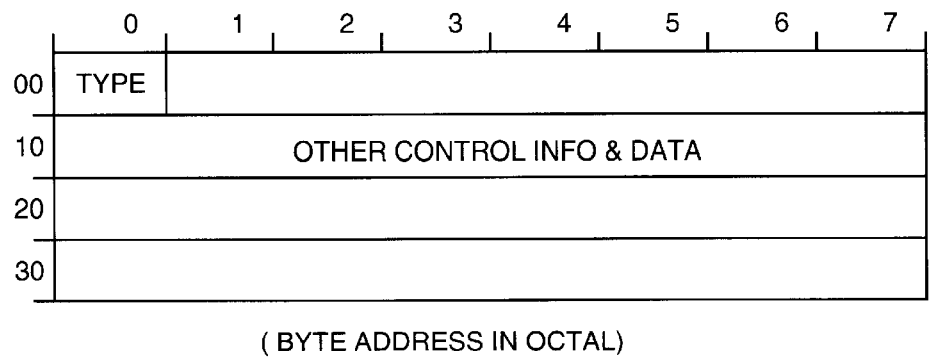
Figure 3D:
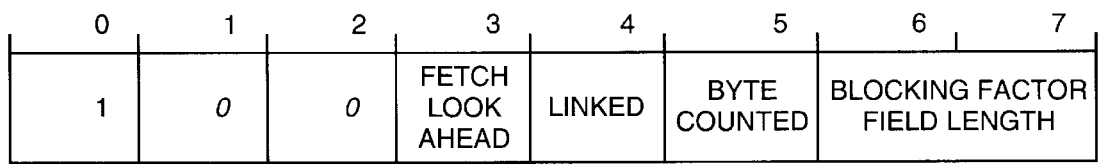

For the illustrated embodiment, each record 204 is accessed by successively locating its blocks 206, and each block 206 is located by locating its first chunk 208. FIG. 3b illustrates one embodiment of a composite address 212 employed to locate the first chunk 208 of a block 206. As shown, composite address 212 includes a first portion that identifies the segment 202 to which the chunk 208 is a member, and a local address (offset) within the identified segment 202 where the chunk 208 starts. FIG. 3c illustrates one embodiment of a generic first chunk 208 of a block 206. As shown, the first 8-bits denote the record type and other control information. If bit-0 is zero, the record type is a raw record type. In this case, bit-1 through bit-7 in conjunction with the next 8-bits (15 bits altogether) are used to denote the blocking factor, i.e. the number of contiguous chunks 208 employed to form a block 206. If bit-0 is one, the record type is one of the other five record types, interpreted in accordance with the next 7-bits, as set forth in FIG. 3d. Bits 1 and 2 are reserved and set to zeroes. Bit-3 denotes whether fetch ahead is to be performed. Bit 4 denotes the presence of a link field in the chunk, which is employed by the raw, counted as well as the free record types. Bit 5 denotes the presence of a byte count field in the chunk, which is used by the counted record type only. Bits 6 and 7 denote the byte size of a blocking factor field in the chunk minus one. For the sysinfo record type, the value is "00". For the index as well as counted record type, the value is "01". For the free record type, the value is "11". Accordingly, the various record types are differentiated.

Figure 3E:
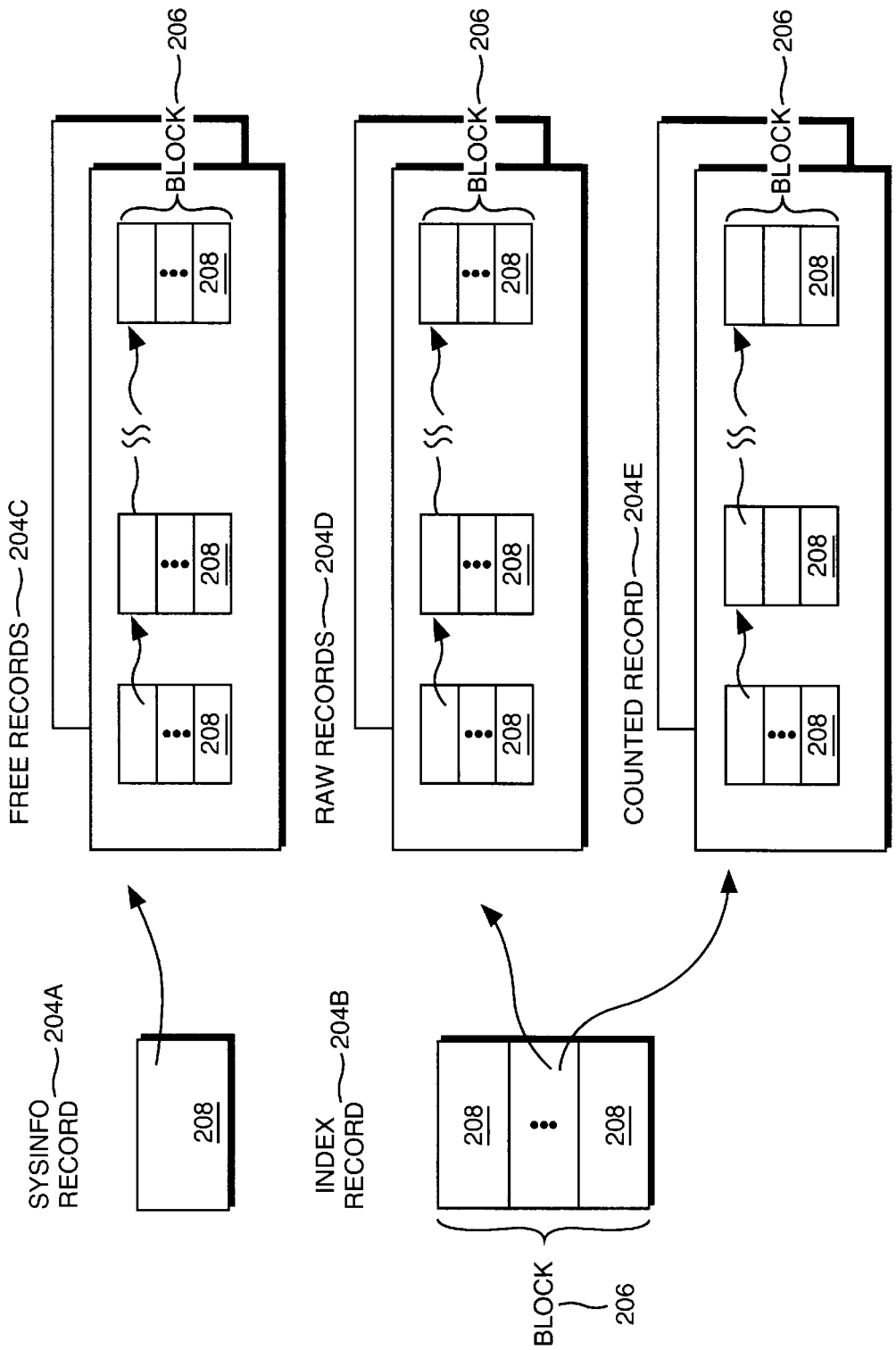

FIG. 3e illustrates records 204 of the various record types in further detail. As shown, PDB 104 includes one record 204a of a sysinfo record type, which is a single chunk record, and a record 204b of a index record type, which is a single block record. Sysinfo record 204a contains in particular an index to the first free chunk 208, whereas index record 204b contains in particular indices to the first chunk of each of the records of the raw or counted record type. Free records 204c, raw records 204d and counted record 204e are all constituted with linked blocks 206 of chunks 208. Their differences lie in the first chunk 208 of each linked block 206, to be described more fully below.

Figure 3H:
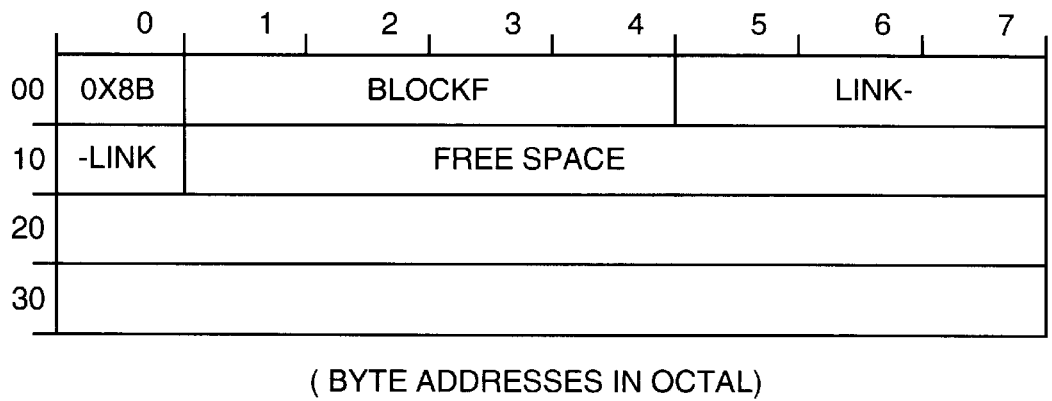

FIG. 3f illustrates one embodiment of the single chunk 208 of the sysinfo record 204a. As shown, in addition to the record type information stored in the first byte as described earlier, the earlier described index to the first free chunk is stored in bytes 7–12 (octal). Furthermore, various control information such as a serial number and a designator (or signature) are stored in bytes 2–6. FIG. 3g illustrates one embodiment of the single block 206 (34 chunks 208) of the index record 204b. As shown, in addition to the record type information stored in the first byte as described earlier, 256 indices to 256 first chunks of 256 records are stored in bytes 50–2040 (octal). Furthermore, 256 corresponding written flags that serve as "indicator bits" of the records are stored in bytes 10–47(octal) to allow client determination of valid data. FIG. 3h illustrates one embodiment of the first chunk 208 of each block 206 a free record 204c. As shown, in addition to the record type information stored in the first byte as described earlier, a blocking factor is stored in bytes 2–4 (octal), and a link to the first chunk 208 of the next free block is stored in bytes 5–10 (octal).

Figure 3I:
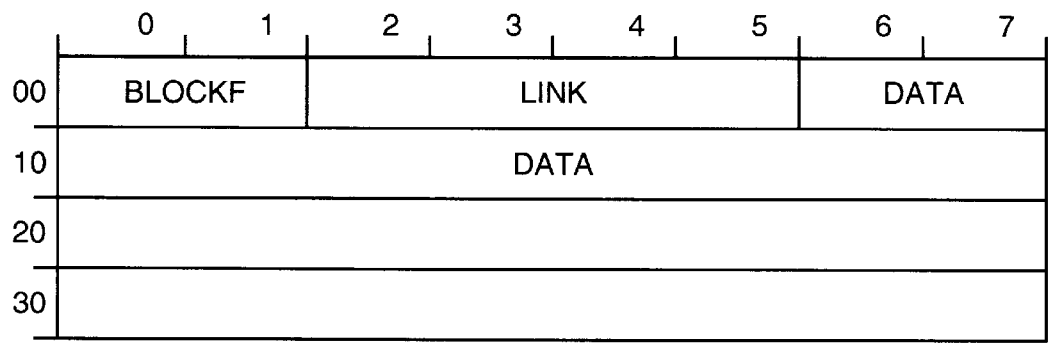

FIG. 3i illustrates one embodiment of the first chunk 208 of each block 206 of a raw record 204d. As shown, in addition to the blocking factor stored in bytes 0–1 as described earlier, a link to the first chunk 208 of the next block 206 is stored in bytes 2–5 (octal). FIG. 3j illustrates one embodiment of the first chunk 208 of the first block 206 of a counted record 204e. As shown, in addition to the record type information stored in the first byte as described earlier, a blocking factor is stored in bytes 1–2 (octal) and a link to the first chunk 208 of the next block 206 is stored in bytes 3–6 (octal). Furthermore, a last block address, a last byte offset and a block count are stored in bytes 7–12 (octal), bytes 13–16 (octal) and bytes 17–22 (octal). The last block address contains the composite address of the last block of the counted record 204e, whereas the last byte offset contains the offset of the next byte to be read or written in the counted record 204e relative to the beginning of the last block. The block count denotes the number of blocks 206 linked. FIG. 3k illustrates one embodiment of the first chunk 208 of a subsequent block 206 of a counted record 204e. As shown, in addition to the record type information stored in the first byte as described earlier, a blocking factor is stored in bytes 1–2 (octal) and a link to the first chunk 208 of the next block 206 is stored in bytes 3–6 (octal). Thus, the primary difference between a raw record 204d and a counted record 204e is that the end of record is tracked for counted record 204e, enabling append operations to be performed across session boundaries.

FIG. 4 illustrates one embodiment of a physical interface employed to access physical records 204 of PDB 104. As shown, input/output streams 228–232 are employed to read from and/or write to records 204. For the illustrated embodiment, an instance of stream 228, 230 or 232 is employed to access each record 204. Streams 228–232 may be one of three types, pdb_itream 228, pdb_ostream 230 and pdb_iostream 232. When an instance of pdb_itream 228 is employed, the associated record 204 may be written to, whereas when an instance of pdb_ostream 230 is employed, the associated record 204 may be read. When an instance of pdb_iostream 232 is employed, the associated record 204 may be read as well as written to. Recall that index record 204b comprises corresponding write flags to facilitate individualized locking of the records. Instances of streams 228–232 are first created and subsequently located on behalf of a client application, by the client application invoking create method 222 and locate method 224 of PDB's physical manager 220 respectively. Create method 222, locate method 224 and streams 228–232 may be implemented using any one of a number of techniques known in the art.

Figure 5A:
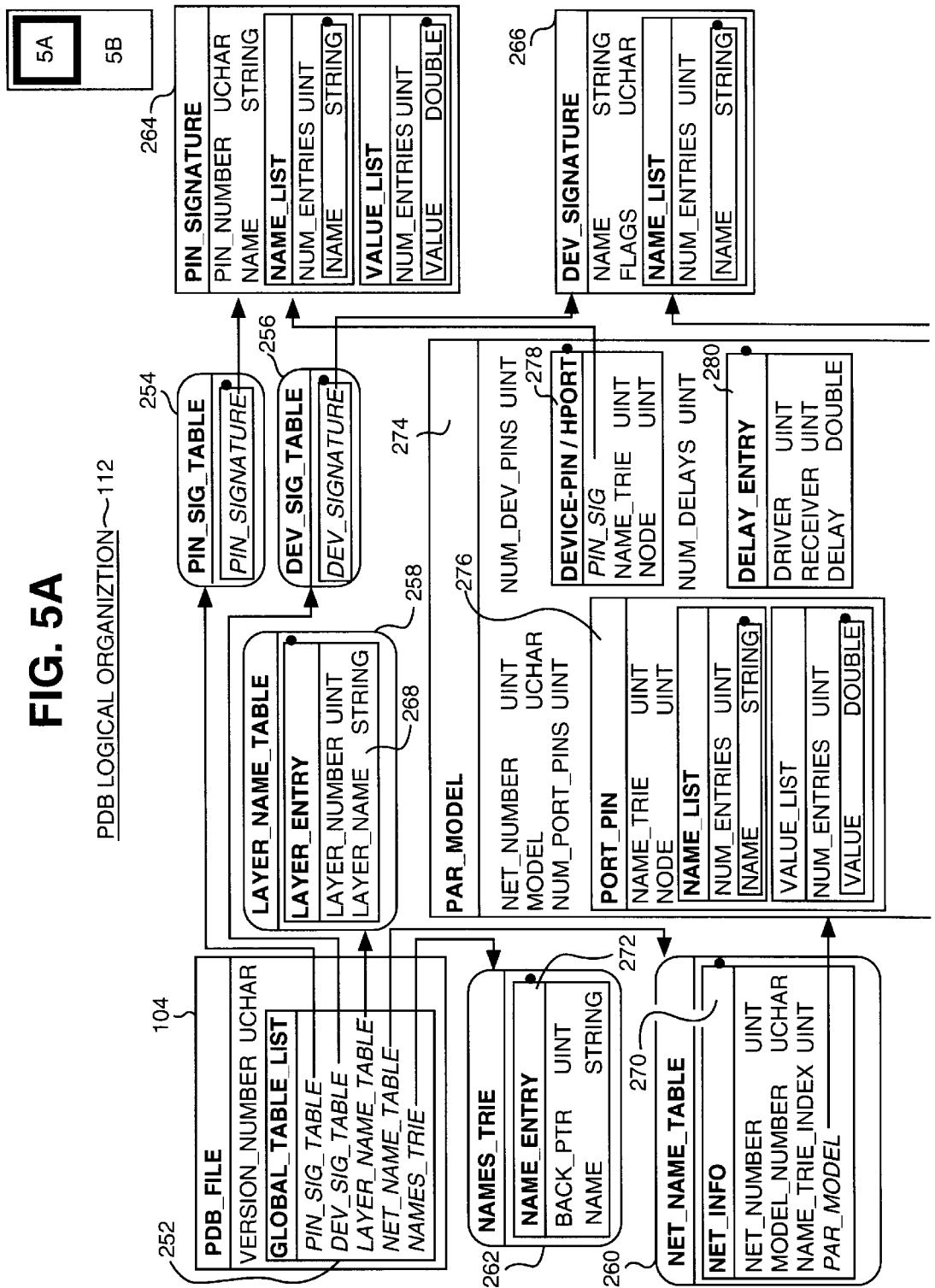
FIG. 5 illustrates one embodiment of a logical abstraction of the physical organization of PDB.
Figure 5B:
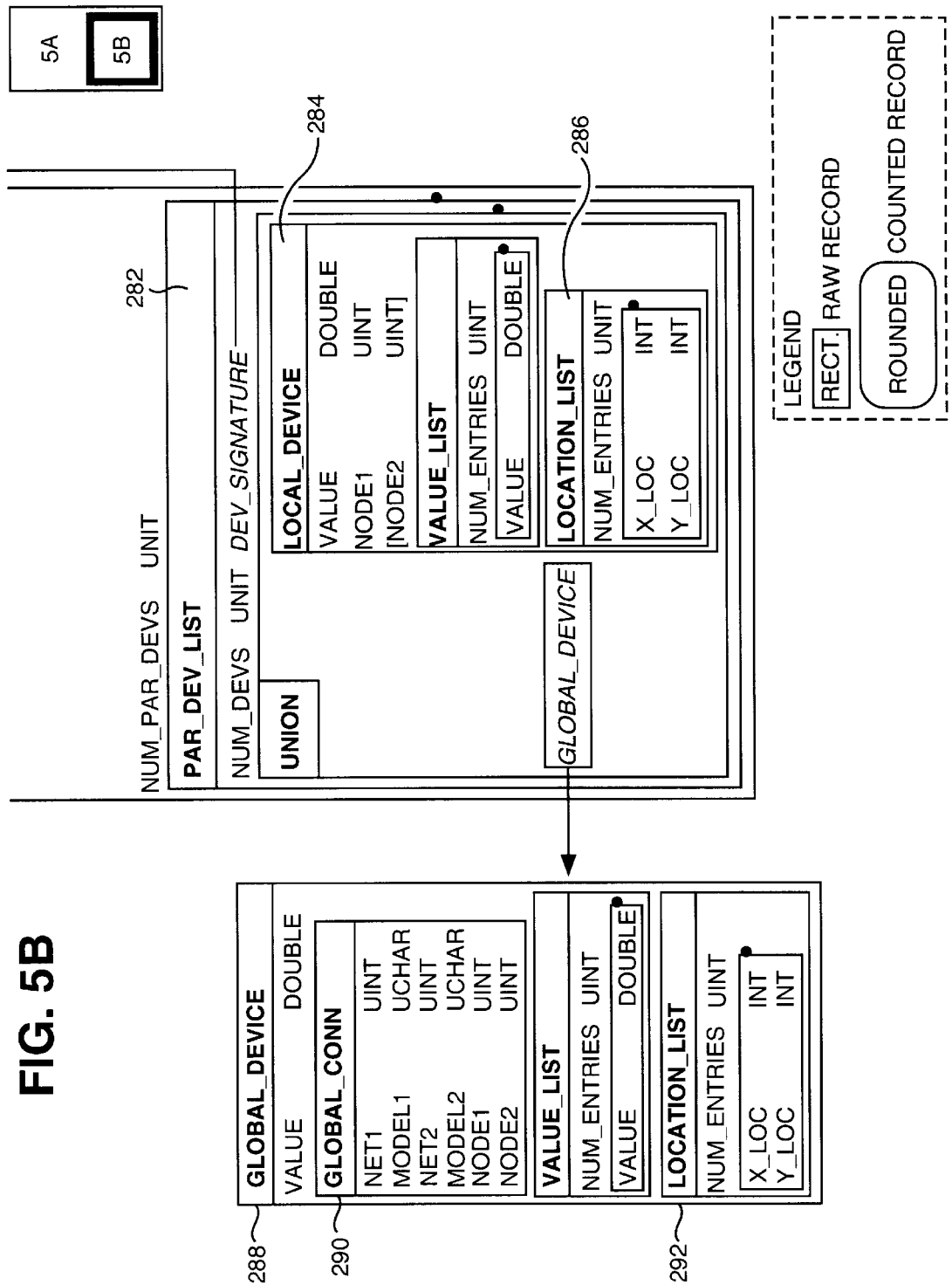

FIG. 5 illustrates one embodiment of a logical abstraction of the electrical modeling data of PDB 104. As shown, PDB 104 is logically abstracted as being constituted with a collection of tables (global_table_list) 252 including pin signature table (pin_sig_table) 254, device signature table (dev_sig_table) 256, layer name table (layer_name_table)

258, net name table (net_name_table) 260, and name table (name_trie) 262. Pin_sig_table 254 is comprised of pin signatures 264, and dev_sig_table 256 is comprised of device signatures 266. Layer_name_table 258 is comprised of layout layer names 268, and name_table 262 is comprised of name entries 272 which are efficient storage structures for hierarchical net names. Net_name_table 260 is comprised of net information 270, in particular, the net's net number, its electrical model number, a pointer to the parasitic model (par_model) and a pointer to its name 274.

Each parasitic model 274 is comprised of port information (port_pin) 276, device pin information (device_pin/hport) 278, delay information (delay_entry) 280, and a list of the parasitic devices (par_dev_list) 282. For the local parasitic devices, each parasitic device entry includes information about the local devices 284, such as their locations 286. For the gloabl parasitic devices, each parasitic device entry includes pointers to the global devices 288, where information about the global devices 288, such as their locations 286 are stored. Each global device 288 includes connectivity as well as location data 290 and 292. Hports are ports of an instance of an hcell, which is a cell named by a user as a correspondence point for layout verification.

For the illustrated embodiment, each "box" is a record, with a rectangular box denoting a record of the raw record type, and a rounded corner box denoting a record of the counted record type. For example, a record of the raw record type is employed for global_table_list 252, whereas a record of the counted record type is employed for net_name_table 260. In the case of layer_name_table 258, it uses records of both types. Associated with each of these data records are the composite addresses (not shown) denoting their physical locations in PDB 104. The data types of the various data elements are shown next to the data elements. The data types "uchar", "ushort" and "uint" stand for 1-byte unsigned integer, 2-byte unsigned integer, and 4-byte unsigned integer respectively. The data types "int", "double" and "string" stand for 4-byte signed integer, 8-byte floating point, and a Null terminated character string respectively. In one embodiment, the integer data are kept in big endian format. In an alternate embodiment, little endian format may be employed.

Figure 6:
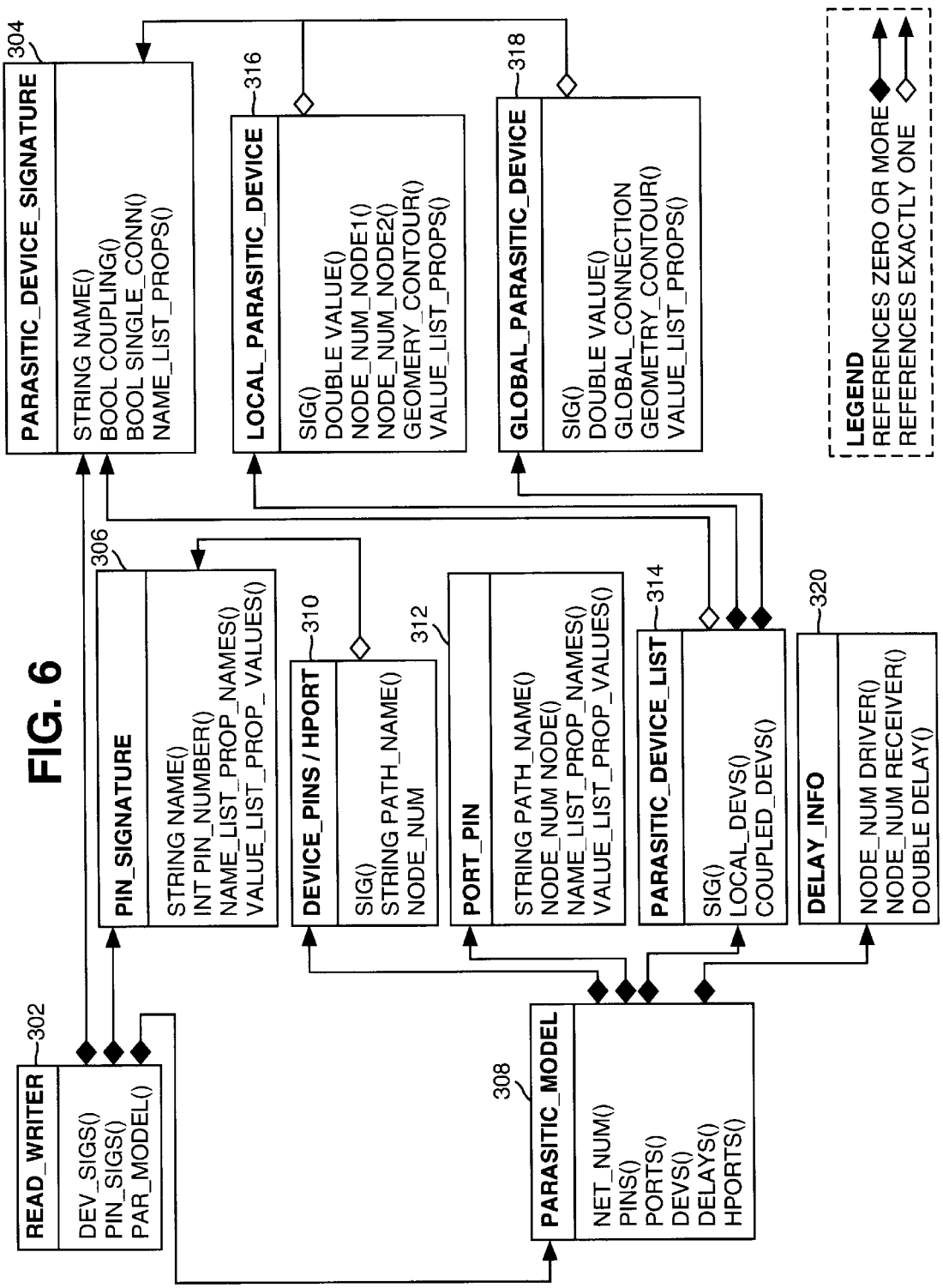
FIG. 6 illustrates one embodiment of an application interface for client applications to access PDB.

FIG. 6 illustrates one embodiment of an application interface for facilitating client application in accessing PDB 104. Application interface 110 includes a number of objected oriented programming classes 302–320, including reader-write class 302, parasitic_device_signature class 304, pin_signature class 306, parasitic_model class 308, device_pin/hport class 310, port_pin class 312, parasitic_device_list class 314, local_parasitic_device_class 316, global_parasitic_device class 318, and delay_info class 320.

A client application employs reader_writer class 302 to read and write data into PDB 104. Each instance of reader_writer class 302 refers to zero or more instances of parasitic_device_signature class 304, zero or more instances of pin_signature class 306, and zero or more instances of parasitic model class 308. In addition, reader_writer class 302 includes device signature methods (dev_sig()), pin signature methods (pin_sig()), and parasitic model methods (par_model()). Device signature methods are invoked to retrieve a list of parasitic device signatures and optionally, add a new parasitic device signature to the retrieved list. Pin signature methods are invoked to retrieve a list of pin signatures and optionally, add a new pin signature to the retrieved list. Parasitic model methods are invoked to create or clone a parasitic model.

Parasitic_device_signature class 304 includes a name method (name()), a coupling method (coupling()), a connection method (single_conn()), and a property method (name_list_props()). Name() is used to retrieve the name of the parasitic device. In one embodiment, an "r" and an "c" prefix is employed in the naming convention to differentiate resistance and capacitance devices. Coupling()) is used to return a logical true value if the signature is for a coupling device. If the device is coupled to another, it is stored as a global device, otherwise, it is stored as a local device. Single_conn() is used to return a true value if the second connection of the device is always connected to ground. Name_list_props() is used to retrieve a list of property names for the device. The property values are stored with the device.

Pin_signature class 306 includes a name method (name()), a pin number method (pin_number()), a name list property method (name_list_prop_names()), and a value list property method (value_list_prop_values()). Similarly, Name() is used to retrieve the name of a pin on a device. Pin_number() is used to return the pin number of the pin. Name_list_prop_names() and value_list_prop_values() are used to retrieved a list of property names and property values for the pin's pin type.

Each instance of parasitic_model class 308 references zero or more device_pin/hport class 310, zero or more instances of port_pin class 312, zero or more instances of parasitic_device_list 314, and zero or more instances of delay_info 320. In addition, parasitic_model class 308 includes a net number method (net_num()), pin methods (pin)), port methods (port()), device methods (dev)), delay methods (delay)), and hport methods (hport()). Net_num() is used to retrieve the global net number of the parasitic model. Pin() are used to retrieve a list of device pins connected to this net, and add new pins to the retrieved list. Port() are used to retrieve a list of ports connected to the net, and add new ports to the retrieved list. Dev() are used to retrieve a list of parasitic devices that are part of the model, and add new devices to the retrieved list. Delay() are used to retrieve a list of propagation delays for the model, add and clear delay information in the model. Hport() are used to retrieve a list of hports connected to the net, and add new hport to the retrieved list.

Each instance of a device_pin/hport class 310 references exactly one instance of pin_signature class 306 described earlier. Device_pin/hport class 310 includes a signature method (sig)), a path name method (path_name()) and a node number method (node_num()). Sig() is used to retrieve the signature of the device pin. Path_name() is used to retrieve the fully qualified layout name for the device the pin belongs to. Node_num() is used to retrieved the local node number the pin connects to.

Port_pin class 312 includes path name method (path_name()), node number method (node_num()), a name list property method (name_list_prop_names()), and a value list property method (value_list_prop_values()). Path_name() is used to retrieve the fully qualified layout name for the port. Node_num() is used to retrieved the local node number the port connects to. Name_list_prop_names() and value_list_prop_values() are used to retrieved a list of property names and property values for the port.

Each instance of a parasitic_device_list class 314 references exactly one instance of parasitic_device_signature class 304 described earlier, one or more instances of local_parasitic_device class 316, and one or more instances of global_parasitic_device class 318. Parasitic_device_list class 314 includes a signature method (sig()), local device methods (local_devs)) and coupled device methods (coupled_devs()). Sig() is used to retrieve the signature of the parasitic device. Local_devs() are used to retrieve a list of local parasitic devices, and add new local parasitic devices to the retrieved list. Coupled_devs() are used to retrieve a list of global parasitic devices, and add new global parasitic devices to the retrieved list.

Delay_info class 320 includes a driver node number method (node_num_driver)), a receiver node number method (node_num_receiver()), and a delay method (delay)). Node_num_driver and node_num_receiver() methods are used to retrieve the driver and receiver node numbers for the delay. Delay() is used to retrieve the propagation delay between the two nodes.

Each instance of a local_parasitic_device class 316 references exactly one instance of parasitic_device_signature class 304 described earlier. Local_parasitic_devic class 316 includes a signature method (sig()), a value method (value()), two node number methods (node_num_node1() and node_num_node2()), a geometry contour method (geometry_contour()), and a property value list method (value_list_prop()). Sig() is used to retrieve a reference to the device signature of device. Value() is used to retrieve the value of the local parasitic device, i.e. a number in ohms for resistance device, and a number of farads for capacitance device. Node_num_node1() and node_num_node2() are used to retrieved the connecting nodes on the device. Geometry_contour() is used to retrieve a number of locations that outline the local parasitic device. Value_list_prop() is used to retrieve a list of property values for the local parasitic device.

Each instance of a global parasitic_device class 318 also references exactly one instance of parasitic_device_signature class 304 described earlier. Global_parasitic_devic class 318 includes a signature method (sig)), a value method (value)), a global connection (global_conn)), a geometry contour method (geometry_contour()), and a property value list method (value_list_prop)). Sig() is used to retrieve a reference to the device signature of device. Value() is used to retrieve the value of the global parasitic device, i.e. a number in ohms for resistance device, and a number of farads for capacitance device. Global_conn() is used to retrieve global connection information about the global parasitic device. Geometry_contour() is used to retrieve a number of locations that outline the global parasitic device. Value_list_prop() is used to retrieve a list of property values for the global parasitic device.

The above described methods access appropriate ones of the physical records through the input/output stream instances (created or located by the physical manager), using the logical abstraction described earlier. For examples, the device signature method accesses a parasitic device signature physical record through an input/output stream instance associated with the physical record, using dev_signature 266 of FIG. 5, and the pin signature method accesses a pin signature physical record through an input/output stream instance associated with the physical record, using pin_signature 264 of FIG. 5. Implementation of these classes and methods using conventional object oriented programming tools, such as C++, are well within the ability of those skilled in the art of object oriented programming. Accordingly, these classes and their methods will not be further described. Additionally, in alternate embodiments, alternate and/or additional classes, e.g. a read only class, and/or methods may also be used.

Figure 7B:
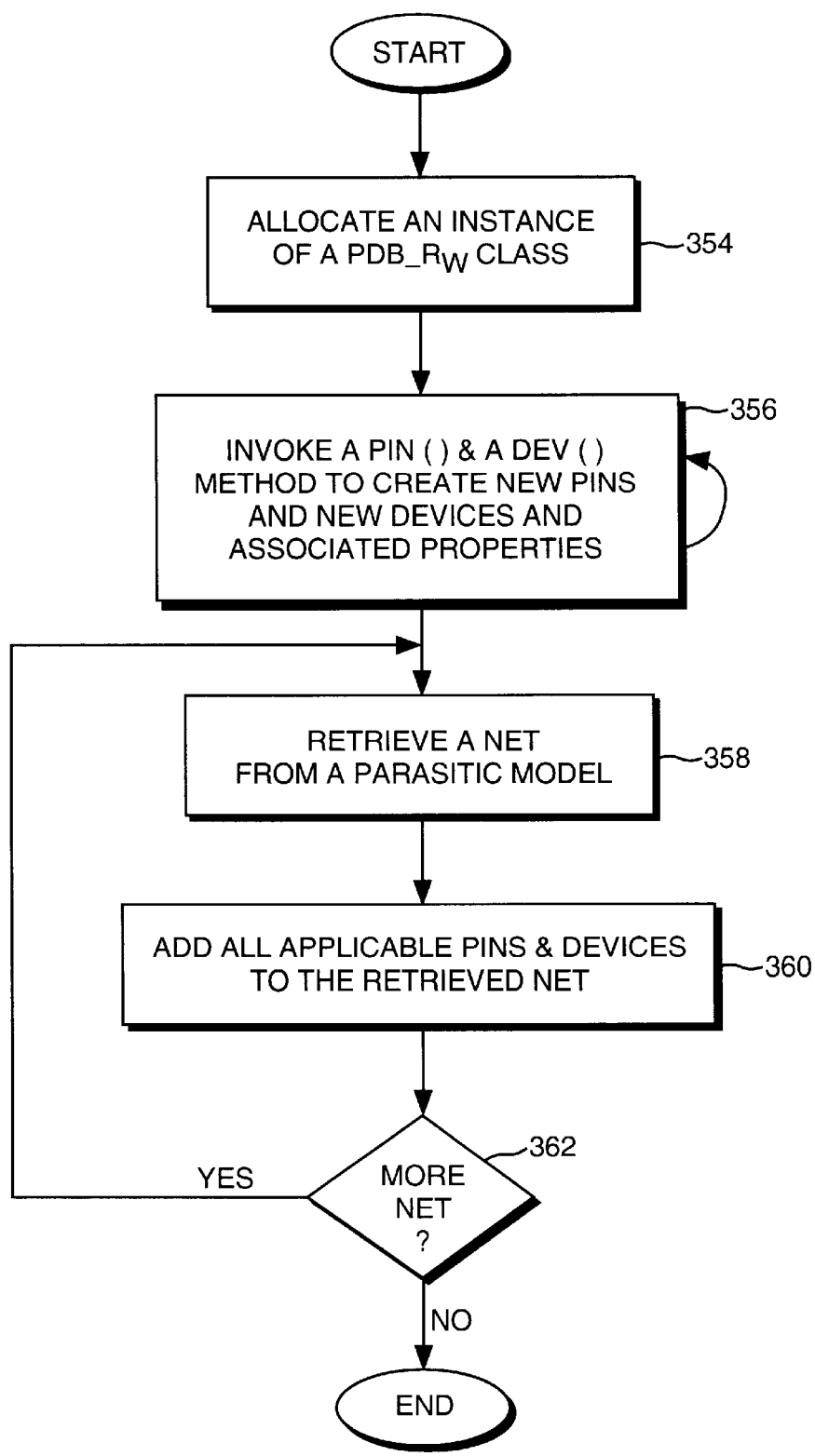

Referring now FIGS. 7a–7b, where two block diagrams illustrating one embodiment each of the operational flow of an exemplary series of read operations of a client application, and an exemplary series of read/write operations of another client application are shown. FIG. 7a assumes the application interface of PDB 104 includes a read-only class similar to the read-write class of FIG. 6. As shown in FIG. 7a, for the exemplary series of read operations, starting at step 332, the client application requests an instance of the PDB read-only class to be created. At step 334, the client application reads a net identifier from a input netlist. The input netlist may be provided in any manner known in the art. At step 336, the client application invokes a pin() of the read-only class to read (i.e. retrieve) the pin signatures of the net. Similarly, at steps 338–340, the client application invokes a port() and a dev() of the read-only class to read/retrieve the ports and device signatures of the net.

Next, the client application selects a retrieved device, step 342, and checks if the selected device is coupled device, i.e. a global device, step 344. At step 346, the client application invokes the appropriate "local" or "global" method of a parasitic model class referenced by the read-only class to read/retrieve the parasitic data of the local/global parasitic device. At step 348, the client application determines if there are more parasitic devices to be processed. If so, the client application repeats steps 342–348. The client application repeats these steps, until eventually at step 348, client application determines that all parasitic devices have been processed. At such time, the client application proceeds to step 350 to output the retrieved parasitic and related data for all the devices of the net.

At step 352, the client application determines if there are more nets to be processed. If so, the client application repeats steps 334–352. The client application repeats these steps, until eventually at step 352, client application determines that all nets of interest have been processed. At such time, the client application terminates the exemplary series of read operations.

As shown in FIG. 7b, for the exemplary series of read/write operations, starting at step 354, the client application requests an instance of the PDB read-write class to be created. At step 356, the client application repeatedly invokes a pin() and a dev() to create new pins and new devices in PDB 104, and store information associated with these newly created pins and devices in PDB 104.

At step 358, the client application retrieves a net from an instance of a parasitic model class referenced by the read-write class. At step 360, the client application invokes the appropriate methods to add all application pins and devices to the retrieved net 360. Then, at step 362, the client application determines if there are more nets can be retrieved. If so, the client application repeats steps 358–362. The client application repeats these steps, until eventually at step 362, client application determines that all nets of the parasitic model have been retrieved and processed. At such time, the client application terminates the exemplary series of read-write operations.

FIG. 8 illustrates one embodiment of a computer system suitable for programming with the data extraction tool of the present invention. As shown, for the illustrated embodiment, computer system 380 includes processor 382, system bus 384 and standard I/O bus 394. System bus 384 and I/O bus 394 are bridged by bus bridge 388. Coupled to system bus 384 are system memory 396 and video memory 390, against which video display 392 is coupled. Coupled to I/O bus 394 are fixed storage 396, removable storage 398, communication interface 400 and keyboard and pointing device 402.

Examples of fixed storage 396 include magnetic and optical disk drives. Examples of removable storage 398 includes magnetic tape drive, diskette drive, CD-ROM drive and DVD drive. Examples of communication interface 400 include modem, ISDN adapter and network adapter.

These elements perform their conventional functions known in the art. In particular, fixed storage 396 and system memory 386 are used to store a permanent and a working copy of the programming instructions for effectuating the teachings of the present invention, when executed by processor 382. Fixed storage 396 and system memory 386 may also be used to store similar copies of other EDA tools and operating system. The permanent copy of the programming instructions that effectuate the present invention (when executed by processor 382) may be pre-installed in the factory by the manufacturer of computer system 380. Alternatively, it may be loaded from a distribution medium 399, such as a tape, a CD-ROM, or a DVD, through removable storage 398, or from a remote server 401 through communication interface 400. Furthermore, PEX 102 and PDB 104 may be implemented on different ones of computer system 380 or equivalent, communicatively coupled to each other. The constitutions of these elements are known. Any one of a number of implementations of these known elements may be used to form computer system 380.

While for ease of understanding, the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, a method and apparatus for generating and maintaining electrical modeling data for a deep sub-micron IC design has been described

What is claimed is:

1. A machine readable storage medium having stored therein a plurality of machine executable instructions that implement a parasitic extraction tool to generate electrical modeling data for an integrated circuit (IC) design, wherein the parasitic extraction tool includes a read function to input extracted connectivity and geometrical data of various layout nets of the IC design from at least one filtered database, said connectivity and geometric data having been filtered based at least in part on parasitic effect windows of respective layout layers, wherein a particular parasitic effect window defines a distance from geometric shapes on a given layout layer beyond which parasitic effects are ignored.

2. The machine readable storage medium of claim 1, wherein the at least one filtered database is organized by layout cell hierarchies.

3. The machine readable storage medium of claim 1, wherein the read function is to access the at least one filtered database using layout net indices.

4. A machine readable storage medium having stored therein a plurality of machine executable instructions that implement a parasitic extraction tool to generate electrical modeling data for an integrated circuit (IC) design, said electrical modeling data having been extracted from at least one filtered database, said filtered database having been filtered based at least in part on parasitic effect windows of respective layout layers of the IC design, wherein a particular parasitic effect window defines a distance from geometric shapes on a given layout layer beyond which parasitic effects are ignored, said parasitic extraction tool including a write function to store the generated electrical modeling data into a parasitic database (PDB), said PDB comprising multiple physical storage media, and wherein said write function is to write the generated electrical modeling data to the PDB in a logical organization of interrelated records to accommodate concurrent access by multiple client applications.

5. The machine readable storage medium of claim 4, wherein the interrelated records comprise one or more associated blocks of contiguous storage location chunks.

6. The machine readable storage medium of claim 4, wherein the write function locates each interrelated record by locating a first storage location chunk of a respective record.

7. The machine readable storage medium of claim 4, wherein the write function stores the generated electrical model data into the interrelated records, employing records of different record types.

8. The machine readable storage medium of claim 7, wherein the different record types include a raw record type and a counted record type, wherein a last read/write position of a record of the raw record type is not tracked, and the last read/write position of a record of the counted record type is tracked.

9. The machine readable storage medium of claim 4, wherein the PDB further comprises a physical manager having a create function to create instances of input/output streams, and wherein the write function is further to employ the create function to create the interrelated records through corresponding created input/output stream instances.

10. The machine readable storage medium of claim 4, wherein the PDB further comprises a physical manager having a locate function to locate created instances of input/output streams, and wherein the write function is further to employ the locate function to locate particular interrelated records through corresponding created input/output stream instances.

11. The machine readable storage medium of claim 4, wherein the logical organization of interrelated records comprises a logical abstraction of the interrelated records, including one or more of a logical PDB file entity, a logical layer name table entity, a logical pin signature table entity, a logical device signature table entity and a logical net name table entity, and wherein the write function accesses the logical organization through the logical abstraction of the interrelated records.

12. The machine readable storage medium of claim 4, wherein the logical organization of interrelated records comprises a logical abstraction of the interrelated records including one or more of a logical parasitic model entity, a logical local parasitic device entity and a global parasitic device entity, and wherein the write function accesses the logical organization through the logical abstraction of the interrelated records.

13. The machine readable storage medium of claim 4, wherein the interrelated records include records of different record types, the logical organization of interrelated records comprises a logical abstraction of the interrelated records including different logical abstraction entities, employing records of different record types, and wherein the write function accesses the logical organization through the logical abstraction of the interrelated records.

14. The machine readable storage medium of claim 4, wherein the logical organization of interrelated records includes an application interface to facilitate access to the logical organization and to shield the multiple physical storage media of the PDB from an accessing client application, and wherein the write function accesses the logical organization through the application interface.

15. The machine readable storage medium of claim 14, wherein the application interface is class based, including one or more of a read-write class, a pin signature class, a parasitic device signature class, and a parasitic model class, and wherein the write function accesses the logical organization through the class based application interface.

16. The machine readable storage medium of claim 14, wherein the application interface is class based, including one or more of a parasitic model class, a device pin class, a port pin class and a delay information class, and wherein the write function accesses the logical organization through the class based application interface.

17. The machine readable storage medium of claim 14, wherein the application interface is class based, including one or more of a parasitic model class, a parasitic device list class, a local parasitic device class and a global parasitic device class, and wherein the write function accesses the logical organization through the class based application interface.

18. A plurality of machine readable storage media having stored therein a parasitic database (PDB) of generated electrical modeling data of an integrated circuit (IC) design, said electrical modeling data having been extracted from at least one filtered database, said filtered database having been filtered based at least in part on parasitic effect windows of respective layout layers of the IC design, wherein a particular parasitic effect window defines a distance from geometric shapes on a given layout layer beyond which parasitic effects are ignored, the PDB being constituted with segments of storage location chunks, the generated electrical modeling data of the IC design being stored in a logical organization of interrelated records constituted with one or more associated blocks of contiguous storage location chunks.

19. The machine readable storage media of claim 18, wherein each interrelated record is located by locating a first storage location chunk of a respective record.

20. The machine readable storage media of claim 18, wherein the interrelated records are typed including a raw record type and a counted record type, wherein a last read/write position of a record of the raw record type is not tracked, and the last read/write position of a record of the counted record type is tracked.

21. The machine readable storage media of claim 18, wherein the PDB further comprises a physical manager having a locate function to locate created instances of input/output streams to facilitate accessing the interrelated records of the generated electrical modeling data through corresponding created input/output stream instances.

22. The machine readable storage media of claim 21, wherein the physical manager further comprises a create function to create the instances of input/output streams.

23. The machine readable storage media of claim 18, wherein the PDB further comprises a logical abstraction of the interrelated records, including one or more of a logical PDB file entity, a logical layer name table entity, a logical pin signature table entity, a logical device signature table entity and a logical net name table entity.

24. The machine readable storage media of claim 18, wherein the PDB further comprises a logical abstraction of the interrelated records including one or more of a logical parasitic model entity, a logical local parasitic device entity and a global parasitic device entity.

25. The machine readable storage media of claim 18, wherein the interrelated records include records of different record types, the PDB further comprises a logical abstraction of the interrelated records including different logical abstraction entities, employing the records of different record types.

26. The machine readable storage media of claim 18, wherein the PDB includes an application interface to facilitate access to the PDB and shield the physical organization of the PDB from an accessing client application.

27. The machine readable storage media of claim 26, wherein the application interface is class based, including one or more of a read-write class, a pin signature class, a parasitic device signature class, and a parasitic model class.

28. The machine readable storage media of claim 26, wherein the application interface is class based, including one or more of a parasitic model class, a device pin class, a port pin class and a delay information class.

29. The machine readable storage media of claim 26, wherein the application interface is class based, including one or more of a parasitic model class, a parasitic device list class, a local parasitic device class and a global parasitic device class.

30. A computer system comprising:
a storage medium having stored therein a plurality of machine executable instructions that implement a parasitic extraction tool to generate electrical modeling data for an integrated circuit (IC) design, wherein the parasitic extraction tool includes a read function to input extracted connectivity and geometrical data of various layout nets of the IC design from at least one filtered database, said connectivity and geometrical data having been filtered based at least in part on parasitic effect windows of respective layout layers, wherein a particular parasitic effect window defines a distance from geometric shapes on a given layout layer beyond which parasitic effects are ignored; and
an execution unit coupled to the storage medium to execute the machine executable instructions.

31. The computer system of claim 30, wherein the at least one filtered database is organized by layout cell hierarchies.

32. The computer system of claim 30, wherein the read function is to access the at least one filtered database using layout net indices.

33. A computer system comprising:
a storage medium having stored therein a plurality of machine executable instructions that implement a parasitic extraction tool to generate electrical modeling data for an integrated circuit (IC) design, said electrical modeling data having been extracted from at least one filtered database, said filtered database having been filtered based at least in part on parasitic effect windows of respective layout layers of the IC design, wherein a particular parasitic effect window defines a distance from geometric shapes on a given layout layer beyond which parasitic effects are ignored, said parasitic extraction tool including a write function to store the generated electrical modeling data into a parasitic database (PDB), said PDB comprising multiple physical storage media, and wherein said write function is to write the generated electrical modeling dada to the PDB in a logical organization of interrelated records to accommodate concurrent access by multiple client applications; and
an execution unit coupled to the storage medium to execute the machine executable instructions.

34. The computer system of claim 33, wherein the interrelated records comprise one or more associated blocks of contiguous storage location chunks.

35. The computer system of claim 33, wherein the write function locates each record by locating a first storage location chunk of a respective record.

36. The computer system of claim 33, wherein the write function stores the generated electrical model data into the interrelated records, employing records of different record types.

37. The computer system of claim 36, wherein the different record types include a raw record type and a counted record type, wherein a last read/write position of a record of the raw record type is not tracked, and the last read/write position of a record of the counted record type is tracked.

38. The computer system of claim 33, wherein the PDB further comprises a physical manager having a create function to create instances of input/output streams, and wherein the write is function further to employ the create function to create the interrelated records through corresponding created input/output stream instances.

39. The computer system of claim 33, wherein the PDB further comprises a physical manager having a locate function to locate created instances of input/output streams, and wherein the write function is further to employ the locate function to locate particular interrelated records through corresponding created input/output stream instances.

40. The computer system of claim 33, wherein the logical organization of interrelated records comprises a logical abstraction of the interrelated records, including one or more of a logical PDB file entity, a logical layer name table entity, a logical pin signature table entity, a logical device signature table entity and a logical net name table entity, and wherein the write function accesses the logical organization through the logical abstraction of the interrelated records.

41. The computer system of claim 33, wherein the logical organization of interrelated records comprises a logical abstraction of the interrelated records including one or more of a logical parasitic model entity, a logical local parasitic device entity and a global parasitic device entity, and wherein the write function accesses the logical organization through the logical abstraction of the interrelated records.

42. The computer system of claim 33, wherein the interrelated records include records of different record types, the logical organization of interrelated records comprises a logical abstraction of the interrelated records including different logical abstraction entities, employing records of different record types, and wherein the write function accesses the logical organization through the logical abstraction of the interrelated records.

43. The computer system of claim 33, wherein the logical organization of interrelated records includes an application interface to facilitate access to the logical organization and to shield the multiple physical storage media of the PDB from an accessing client application, and wherein the write function accesses the logical organization through the application interface.

44. The computer system of claim 43, wherein the application interface is class based, including one or more of a read-write class, a pin signature class, a parasitic device signature class, and a parasitic model class, and the write function accesses the logical organization through the class based application interface.

45. The computer system of claim 43, wherein the application interface is class based, including one or more of a parasitic model class, a device pin class, a port pin class and a delay information class, and wherein the write function accesses the logical organization through the class based application interface.

46. The computer system of claim 43, wherein the application interface is class based, including one or more of a parasitic model class, a parasitic device list class, a local parasitic device class and a global parasitic device class, and wherein the write function accesses the logical organization through the class based application interface.

47. A computer system comprising:
  a plurality of storage media having stored therein a parasitic database (PDB) of generated electrical modeling data of an integrated circuit (IC) design, said electrical modeling data having been extracted from at least one filtered database, said filtered database having been filtered based at least in part on parasitic effect windows of respective layout layers of the IC design, wherein a particular parasitic effect window defines a distance from geometric shapes on a given layout layer beyond which parasitic effects are ignored, the PDB being constituted with segments of storage location chunks, the generated electrical modeling data of the IC design being stored in a logical organization of interrelated records constituted with one or more associated blocks of contiguous storage location chunks; and
  an execution unit coupled to the storage medium to execute the machine executable instructions.

48. The computer system of claim 47, wherein each interrelated record is located by locating a first storage location chunk of a respective record.

49. The computer system of claim 47, wherein the interrelated records are typed including a raw record type and a counted record type, wherein a last read/write position of a record of the raw record type is not tracked, and the last read/write position of a record of the counted record type is tracked.

50. The computer system of claim 47, wherein the PDB further comprises a physical manager having a locate function to locate created instances of input/output streams to facilitate accessing the interrelated records of the generated electrical modeling data through corresponding created input/output stream instances.

51. The computer system of claim 50, wherein the physical manager further comprises a create function to create the instances of input/output streams.

52. The computer system of claim 47, wherein the PDB further comprises a logical abstraction of the interrelated records, including one or more of a logical PDB file entity, a logical layer name table entity, a logical pin signature table entity, a logical device signature table entity and a logical net name table entity.

53. The computer system of claim 47, wherein the PDB further comprises a logical abstraction of the interrelated records including one or more of a logical parasitic model entity, a logical local parasitic device entity and a global parasitic device entity.

54. The computer system of claim 47, wherein the interrelated records include records of different record types, the PDB further comprises a logical abstraction of the interrelated records including different logical abstraction entities, employing the records of different record types.

55. The computer system of claim 47, wherein the PDB includes an application interface to facilitate access to the PDB and to shield the physical organization of the PDB from an accessing client application.

56. The computer system of claim 55, wherein the application interface is class based, including one or more of a read-write class, a pin signature class, a parasitic device signature class, and a parasitic model class.

57. The computer system of claim 55, wherein the application interface is class based, including one or more of a parasitic model class, a device pin class, a port pin class and a delay information class.

58. The computer system of claim 55, wherein the application interface is class based, including one or more of a parasitic model class, a parasitic device list class, a local parasitic device class and a global parasitic device class.

59. A machine implemented method comprising:
  reading extracted connectivity and geometrical data of various layout nets of an integrated circuit (IC) design from a filtered database, said connectivity and geometrical data having been filtered based at least in part on parasitic effect windows of respective layout layers, wherein a particular parasitic effect window defines a distance from geometric shapes on a given layout layer beyond which parasitic effects are ignored;

generating electrical modeling data using the extracted connectivity and geometrical data of the various layout nets read; and writing the generated electrical modeling data into a parasitic database (PDB) physically organized to accommodate physical storing of the generated electrical modeling data in multiple physical media, and concurrent access by multiple client applications.

60. The method of claim 59, wherein reading extracted connectivity and geometrical data comprises accessing one or more databases of extracted connectivity and geometrical data organized by layout cell hierarchies.

61. The computer system of claim 59, wherein writing the generated electrical modeling data comprises locating a record by locating a first storage location chunk of the record.

* * * * *

UNITED STATES PATENT AND TRADEMARK OFFICE
CERTIFICATE OF CORRECTION

PATENT NO. : 6,249,903 B1
DATED : June 19, 2001
INVENTOR(S) : Michael McSherry et al.

It is certified that error appears in the above-identified patent and that said Letters Patent is hereby corrected as shown below:

<u>Column 4,</u>
Line 31, "Using these information" should read -- Using this information --.

<u>Column 6,</u>
Lines 46 and 47, "pdb_itream" should read -- pdb_istream --.

<u>Column 7,</u>
Line 17, "gloabl" should read -- global --.

<u>Column 8,</u>
Line 23, "retrieved" should read -- retrieve --.
Line 31, "(dev))" should read -- (dev()) --.
Line 32, "(delay))" should read -- (delay()) --.
Line 48, "(sig))" should read -- (sig()) --.
Line 52, "retrieved" should read -- retrieve --.
Line 59, "retrieved" should read -- retrieve --.
Line 61, "retrieved" should read -- retrieve --.

<u>Column 9,</u>
Line 2, "(local_devs))" should read -- (local_devs()) --.
Line 10, "(node_num_driver))" should read -- (node_num_driver()) --.
Line 12, "(delay))." should read -- (delay()). --.
Line 12, "Node_num_driver" should read -- Node_num_driver()) --
Line 19, "devic class" should read -- device class --.
Line 33, "global parasitic_device" should read -- global_parasitic_device --.
Line 36, "devic class" should read -- device class --.
Line 36, "(sig))" should read -- (sig()) --.
Line 37, "(value))," should read -- (value()), --.
Line 37, "(global_conn))" should read -- (global_conn()) --
Line 39, "(value_list_prop))." should read -- (value_list_prop()). --.

UNITED STATES PATENT AND TRADEMARK OFFICE
CERTIFICATE OF CORRECTION

PATENT NO. : 6,249,903 B1
DATED : June 19, 2001
INVENTOR(S) : Michael McSherry et al.

It is certified that error appears in the above-identified patent and that said Letters Patent is hereby corrected as shown below:

<u>Column 14,</u>
Line 55, "dada" should read -- data --.

Signed and Sealed this

Twenty-ninth Day of October, 2002

*Attest:*

*Attesting Officer*

JAMES E. ROGAN
*Director of the United States Patent and Trademark Office*